United States Patent
Kim et al.

(10) Patent No.: US 8,362,599 B2
(45) Date of Patent: Jan. 29, 2013

(54) FORMING RADIO FREQUENCY INTEGRATED CIRCUITS

(75) Inventors: Jonghae Kim, San Diego, CA (US); Brian M. Henderson, San Diego, CA (US); Matthew M. Nowak, San Diego, CA (US); Jiayu Xu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 556 days.

(21) Appl. No.: 12/566,338

(22) Filed: Sep. 24, 2009

(65) Prior Publication Data

US 2011/0068433 A1 Mar. 24, 2011

(51) Int. Cl.
*H01L 23/552* (2006.01)
(52) U.S. Cl. ................ 257/660; 257/E23.001
(58) Field of Classification Search .......... 257/531, 257/659, E25.009, E23.001, 660–663
See application file for complete search history.

(56) References Cited

U.S. PATENT DOCUMENTS

| | | |
|---|---|---|
| 2001/0013626 A1 | 8/2001 | Fujii |
| 2003/0127704 A1 | 7/2003 | Kobayashi et al. |
| 2003/0197243 A1 | 10/2003 | Beng et al. |
| 2005/0139954 A1 | 6/2005 | Pyo |
| 2005/0247999 A1 | 11/2005 | Nishikawa et al. |
| 2005/0275061 A1 | 12/2005 | Ohguro |
| 2006/0220773 A1* | 10/2006 | Su et al. ............ 336/200 |
| 2007/0246837 A1 | 10/2007 | Dong |
| 2007/0281438 A1 | 12/2007 | Liu et al. |
| 2008/0174395 A1 | 7/2008 | Lee |
| 2010/0295151 A1 | 11/2010 | Kurokawa |

FOREIGN PATENT DOCUMENTS

| | | |
|---|---|---|
| EP | 1662570 A2 | 5/2006 |
| WO | WO2004036654 A2 | 4/2004 |
| WO | WO2010050091 A1 | 5/2010 |

OTHER PUBLICATIONS

Bartek M. et al., "Wafer-Level Chip-Scale Packaging for Low-End RF Products", Delft University of Technology, Topical Meeting on Silicon Monolithic Integrated Circuits in RF Systems, p. 41-44, 2004.
Mendes P.M. et al., "Wafer-Level Integration of On-Chip Antennas and RF Passives Using High-Resistivity Polysilicon Substrate Technology", Dept. of Industrial Electronics, University of Minho, 1879-1884, 2004.
International Search Report and Written Opinion -PCT/US2010/050293, International Search Authority—European Patent Office—Jan. 27, 2011.

* cited by examiner

*Primary Examiner* — Hoa B Trinh
(74) *Attorney, Agent, or Firm* — Eric Ho

(57) ABSTRACT

Method of forming a radio frequency integrated circuit (RFIC) is provided. The RFIC comprises one or more electronic devices formed in a semiconductor substrate and one or more passive devices on a dielectric substrate, arranged in a stacking manner. Electrical shield structure is formed in between to shield electronic devices in the semiconductor substrate from the passive devices in the dielectric substrate. Vertical through-silicon-vias (TSVs) are formed to provide electrical connections between the passive devices in the dielectric substrate and the electronic devices in the semiconductor substrate.

30 Claims, 10 Drawing Sheets

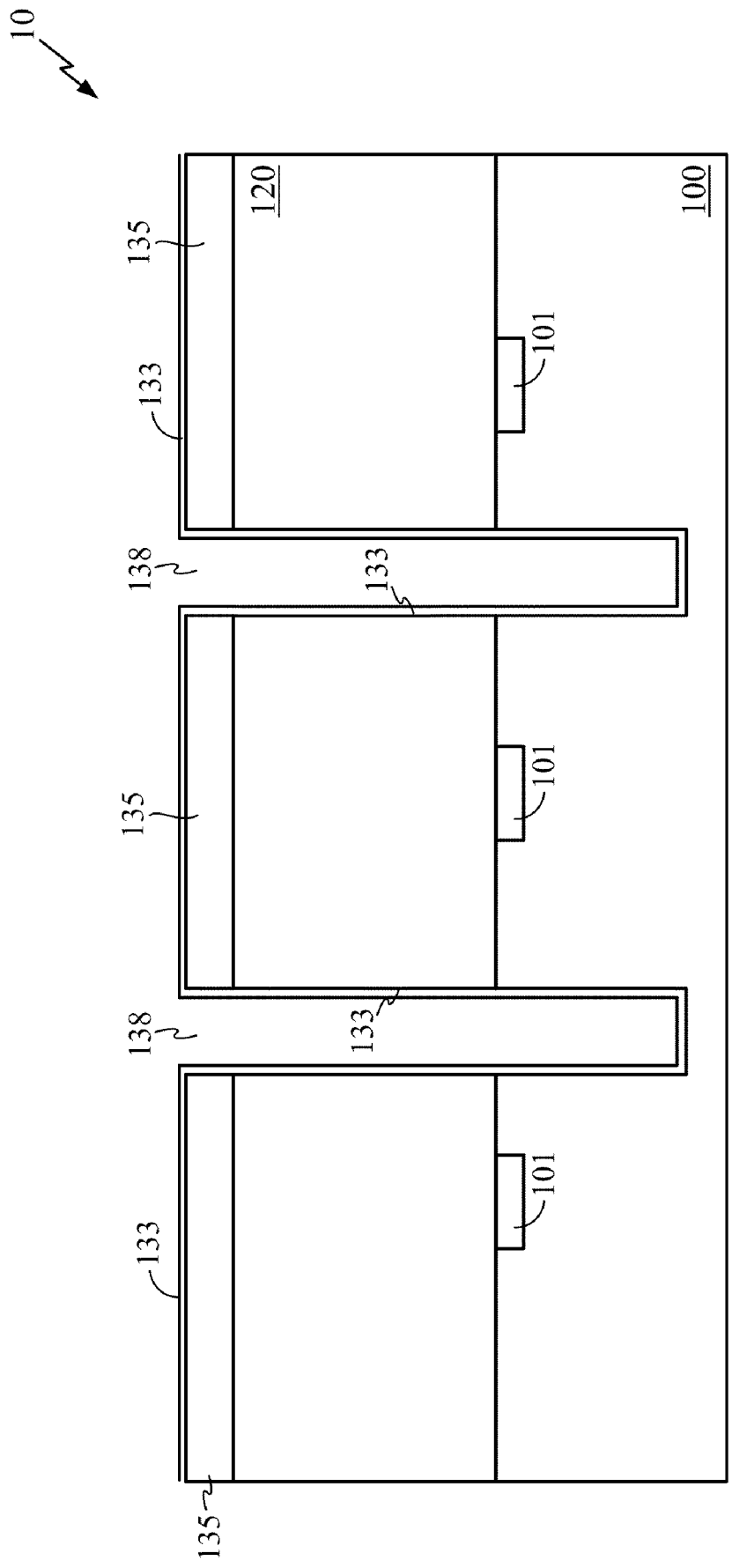

FORMING RADIO FREQUENCY INTEGRATED CIRCUITS

TECHNICAL FIELD

The present invention relates in general to radio frequency (RF) microelectronic devices and more particularly to forming RF integrated circuitry (RFIC) in a Passive-On-Glass (POG) configuration.

BACKGROUND

Wireless communication technology and its applications have made tremendous influences in various aspects of modern society. In the past decades, numerous technical breakthroughs have been realized in wireless communication techniques. These advances are represented by the wide adoption of highly efficient access techniques, such as code division multiple access (CDMA), the integration of digital coding/decoding and digital signal processing techniques into a wireless communication device, and the rapid progress in semiconductor manufacturing techniques that enables integrating a large amount of microelectronic circuits on a semiconductor integrated circuit (IC) die. These progresses have led to wireless communication products of today's, such as a mobile phone, to provide a wide spectrum of high-quality functions and services to their users. In the mean time, progress in semiconductor IC manufacturing technology has significantly reduced the costs associated with making wireless communication products. As a result, market penetration of wireless communication products has been spreading from developed countries to the developing world at a rapid pace.

Due to its low-power, low-cost features, Complementary-Metal-Oxide-Semiconductor (CMOS) manufacturing technology is typically adopted today in manufacturing wireless communication ICs. This includes fabricating an RF front module using CMOS technology. When receiving wireless information, an RF front module processes RF signals received from an antenna and converts the RF signals to baseband signals suitable for further processing. When transmitting wireless information, an RF front module modulates baseband signals to an RF band and transmits the RF signals through an antenna. An RF front module generally includes RF circuits of various kinds, such as low noise amplifier (LNA), frequency synthesizer, mixer, filter, power amplifier, and/or other analog circuits of pre-defined functions. Among other things, an RF circuitry typically includes RF passive components such as inductors and capacitors of large parametric value and large physical footprint. An RF front module plays a critical role on the overall performance of a wireless communication device.

In an existing approach of fabricating RF front module, a typical CMOS technology processing flow is employed to form active and passive components of various kinds in an RF front module. For example, components such as MOS transistors, resistors, MOS capacitors are formed in a monolithic silicon substrate through an existing Front-End-of-Line (FEOL) process flow. Interconnect metal layers are formed over the silicon substrate through an existing Back-End-of-Line (BEOL) process flow. Dielectric layers, such as silicon dioxide ($SiO_2$) layers are formed between adjacent interconnect metal layers, electrically insulating metal traces formed in different metal layers. Also, on-chip inductors such as planar spiral inductors, typically with a large form factor, are formed in the topmost available metal layers through the BEOL process flow. These on-chip inductors are formed and electrically coupled to other components on the silicon substrate through traces formed in the various interconnect metal layers.

Although widely used, this existing approach of fabricating RF front module poses a few drawbacks. First, materials and processing conditions in an existing CMOS process flow are not tailored for the ideal performance of on-chip inductors. As an example, an on-chip inductor formed over the doped silicon substrate as described above exhibits a poor quality factor (Q factor) when compared with a similar inductor formed over a dielectric material, such as a glass substrate. This is described in "*A Power-Optimized Widely-Tunable 5 GHz Monolithic VCO in a Digital SOI CMOS Technology on High Resistivity Substrates*" by J. Kim, IEEE ISLPED 2003. Second, in current practice, the silicon areas under the on-chip inductors are typically left blank in an effort to avoid the undesirable eddy currents induced in the silicon substrate due to the varying magnetic flux from the on-chip inductors. This drawback poses a significant limitation on further reducing the form factor of an RFIC. Although temporary solutions have been proposed, none of the existing solutions are without pitfalls. For example, in one approach, on-chip inductors are displaced to a separate region on an RFIC, and are coupled to other components through horizontal electrical feed-throughs. These horizontal feed-throughs, however, generally increase the footprint size of an RFIC. Among other drawbacks of the existing approach, horizontal feed-throughs create crossing signal lines that may affect circuit performance, lengthy horizontal signal line routings may increase signal latency, and long metal traces may lead to undesirable inductance.

SUMMARY OF THE INVENTION

These and other problems are generally solved or circumvented, and technical advantages are generally achieved, by preferred embodiments of the present invention which provides a method of forming a radio frequency integrated circuit (RFIC). The RFIC comprises one or more electronic devices formed in a semiconductor substrate and one or more passive devices on a dielectric substrate, arranged in a stacking manner. Electrical shield structure is formed to shield electronic devices in the semiconductor substrate from the passive devices in the dielectric substrate. Vertical through-silicon-vias (TSVs) are formed to provide electrical connections between the passive devices in the dielectric substrate and the electronic devices in the semiconductor substrate.

In one preferred embodiment, a method of forming an RFIC comprises forming a plurality of electronic devices and one or more through-silicon vias (TSVs) in a semiconductor wafer. The method also comprises forming one or more passive devices on a dielectric substrate. The method further comprises forming an electrical shield structure between the plurality of electronic devices and the one or more passive devices, the electrical shield structure electrically shielding the plurality of electronic devices from the one or more passive devices. The method even further comprises bonding the dielectric substrate to the semiconductor wafer.

In another preferred embodiment, an RFIC comprises at least one microelectronic device and at least one pass-through-via (TSV) in a semiconductor substrate, at least one electrical shield structure on a first surface of the semiconductor substrate, and at least one inductor on a front surface of a dielectric substrate. The front surface of the dielectric substrate is bonded to the first surface of the semiconductor substrate in a stacking manner, wherein the at least one inductor is electrically coupled to the at least one microelectronic device through the at least one TSV, and wherein the electrical shielding structure electrically shields the at least one microelectronic device from the at least one inductor.

In a further preferred embodiment, a method of forming an RFIC in an Passive-On-Glass (POG) package comprises the steps of forming a plurality of electronic devices and one or more TSVs in a semiconductor wafer, forming an electrical shield structure in a re-distribution (RDL) layer on a first surface of the semiconductor wafer, and forming one or more passive devices on a top surface of a dielectric substrate. The method also comprises bonding the dielectric substrate to the semiconductor wafer at the first surface of the semiconductor wafer and the top surface of a dielectric substrate, forming a stacking wafer structure. The method further comprises bonding the stacking wafer structure to a POG package substrate at a second surface of the semiconductor wafer.

In an additional preferred embodiment, an RFIC in a POG package configuration comprises one or more microelectronic devices and one or more through-silicon-vias (TSVs) in a semiconductor substrate. The RFIC also comprises one or more passive devices on a dielectric substrate, wherein the dielectric substrate is bonded to the semiconductor substrate in a stacking manner, and wherein the one or more passive devices is electrically coupled to the one or more microelectronic device through the one or more TSVs. The RFIC further comprises means for shielding the one or more microelectronic devices from the one or more passive devices.

BRIEF DESCRIPTION OF THE DRAWINGS

For a more complete understanding of the present invention, and the advantages thereof, reference is now made to the following descriptions taken in conjunction with the accompanying drawing, in which:

FIGS. 3A-3C illustrate forming a semiconductor die of an RFIC in an illustrative embodiment;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely method of making RF integrated circuits (RFICs) in a Passive-On-Glass (POG) configuration. However, features, methods, structures or characteristics described according to the preferred embodiments may also be combined in suitable manners to form one or more other embodiments. Also, for clarification, the figures are drawn only to illustrate the relevant aspects of the inventive features or characteristics, and are not drawn to scale.

Figure 1:
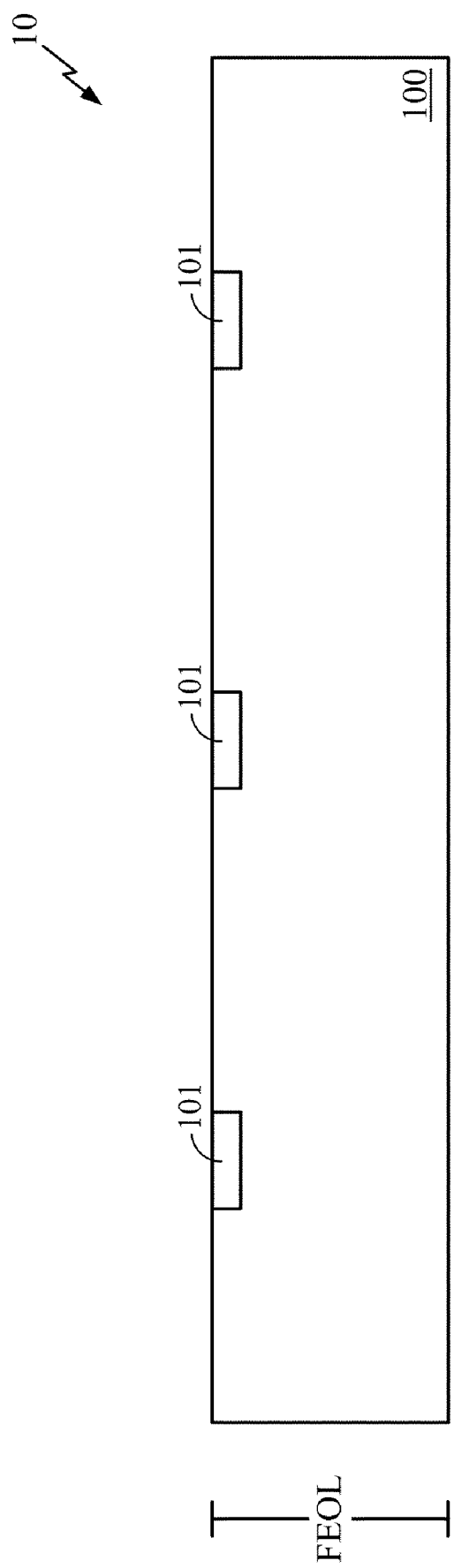
FIG. 1 illustrates forming a semiconductor die of an RFIC in an illustrative embodiment.

With reference now to FIG. 1, there is shown forming one component in a POG RFIC in one exemplary embodiment. FIG. 1 illustrates a cross-sectional diagram of a portion of wafer 10. Wafer 10 comprises substrate 100, which is typically silicon (Si), but may also be made of germanium (Ge), silicon germanium (SiGe), gallium arsenide (GaAs), gallium arsenide-phosphide (GaAsP), indium phosphide (InP), gallium aluminum arsenic (GaAlAs), indium gallium phosphide (InGaP), and the like. Wafer 10 may interchangeably refer to a semiconductor wafer or an integrated circuit die on a semiconductor wafer. In an exemplary embodiment, substrate 100 is a bulk monolithic silicon substrate. In another exemplary embodiment, substrate 100 has a silicon-on-insulator (SOI) configuration. Wafer 10 also comprises devices 101 processed in substrate 100. In one exemplary embodiment, devices 101 may comprise one or more active and passive devices of an RF front module of a wireless communication device. In another exemplary embodiment where an RF front module and a baseband processing module of a wireless communication device are formed on a common Si substrate, devices 101 may comprise one or more active and passive devices in the RF front module and the baseband processing module. Examples of devices 101 include metal-oxide-semiconductor field-effect transistors (MOSFET), bipolar junction transistors (BJT), diodes, resistors, capacitors, etc. Moreover, a device 101 in FIG. 1 may also represent a cluster of active and/or passive devices, a memory, and a functional circuitry with many active and/or passive devices, etc.

Various process flows can be utilized to form devices 101 in substrate 100. Film deposition processes, such as chemical vapor deposition (CVD), spin-on, sputtering, and electroplating can be used to form conductive and dielectric layers on substrate 100, for example. Doping processes, such as diffusion and implantation can be used to add impurities in a semiconductor material to achieve desired conductivity, for example. Photolithography can be used to transfer patterns on a mask to a layer of material on substrate 100, for example. Etching process can be performed after lithography to remove unwanted material layers, for example. Planarization process such as "etch-back" and chemical-mechanical polishing (CMP) can be employed to create a flat surface for the next processing step, for instance. Generally used or ad hoc CMOS FEOL processing flows combining these and other necessary processing steps can be employed to form devices 101 in preferred embodiments, although other suitable processing techniques, such as bipolar and BiCMOS (bipolar and CMOS technology) are not excluded.

Figure 2:
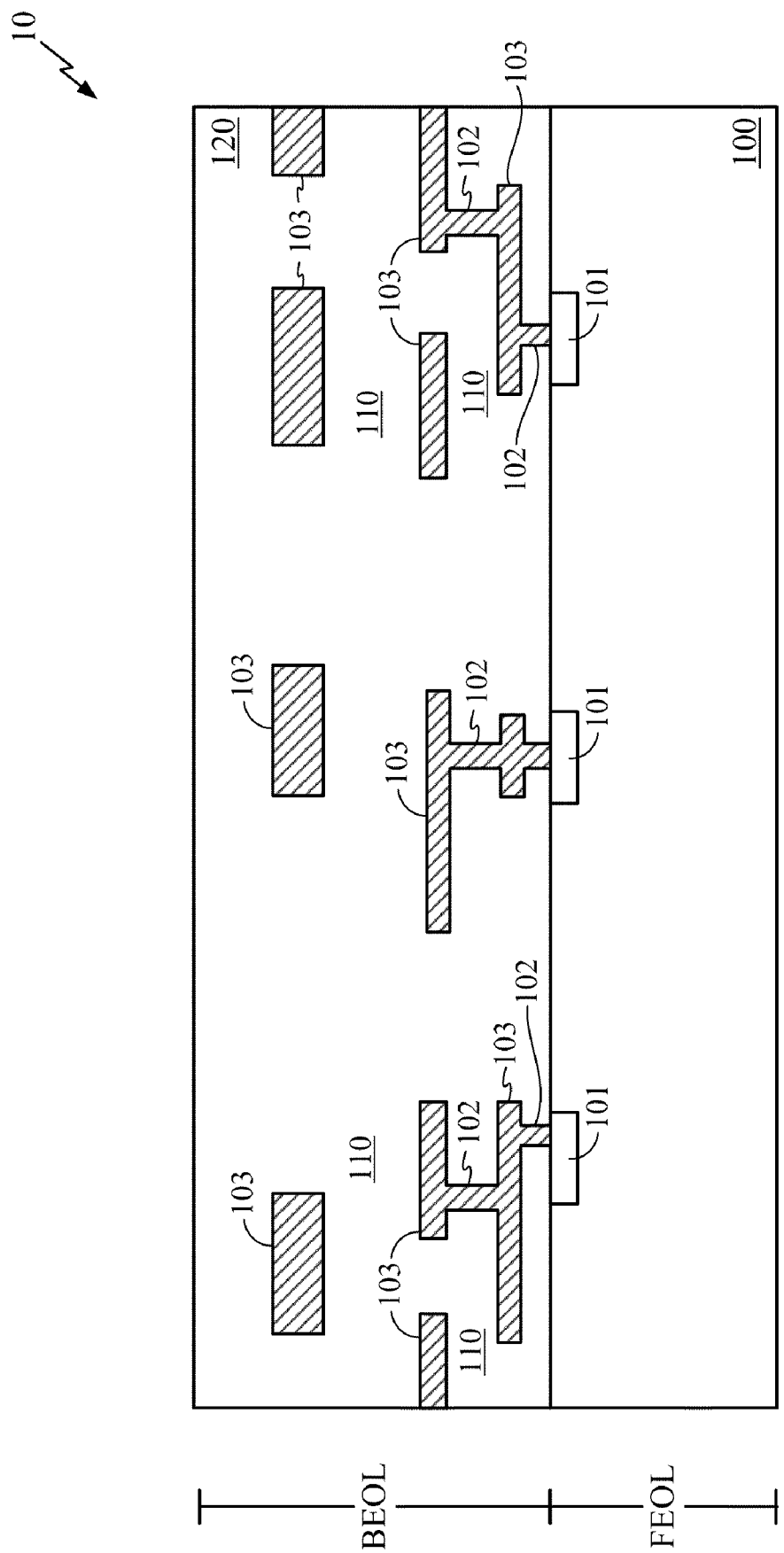
FIG. 2 illustrates forming a semiconductor die of an RFIC in an illustrative embodiment.

Illustrated in FIG. 2, after the formation of devices 101 in substrate 100, various process flows can be utilized to form metal traces 103 in the different interconnect metal layers of wafer 10. Metal traces 103 in different interconnect metal layers are coupled to each other and/or to the devices 101 through vias 102 where electrical connections are needed. Metal traces 103 in adjacent interconnect metal layers are separated by intermetal dielectric layer 110 where electrical isolation is required. Film deposition processes, such as chemical vapor deposition (CVD), spin-on, sputtering, and electroplating can be used to form metal layers 103 and intermetal dielectric layers 110, for example. Photolithography can be used to transfer metal trace patterns on a mask to an interconnect metal layer, for example. Etching process can be performed after lithography to remove unwanted material layers, for example. Planarization processes such as "etch-back" and chemical-mechanical polishing (CMP) can be employed to create a flat surface for the next processing step, for instance. Generally used or ad hoc CMOS BEOL processing flows combining these and other necessary processing steps can be employed to form interconnect traces 103 and vias 102 in preferred embodiments. In an embodiment, interconnect traces 103 and vias 102 comprise metal selected from the group consisting of aluminum (Al), copper (Cu), silver (Ag), tungsten (W), and combinations thereof, although other metals/metal alloys are also within the contemplated scope of the invention. The intermetal dielectric layers 110 may be silicon dioxide ($SiO_2$), silicon nitride ($Si_3N_4$), or other suitable dielectric materials, for example.

It is noted that only a limited number of devices 101, metal traces 103 and vias 102, are shown for the ease of illustration and clarity. Those of ordinary skill in the art will appreciate that, in practice, wafer 10 may include thousands, tens of thousands, millions or more devices 101 and, further, that interconnect traces 103 may include thousands, tens of thousands, millions or more in multiple interconnect metal layers.

It is also noted that, to avoid repetition, like numerals and letters are used for the various features in FIG. 1 and FIG. 2. These features may not be described again in following figures. Moreover, for clarification of illustration, vias 102 and metal traces 103 may not be shown in detail again in the following figures. Instead, BEOL layers 120 is used to indicate the features processed from the CMOS BEOL processing flows described above. Those skilled in the art shall realize that metal interconnect traces are formed after the BEOL processing steps.

Continuing in FIG. 3A, in an exemplary embodiment, insulating layer 135 is deposited on wafer 10. One example of such insulating material that may be used is phosphosilicate glass (PSG). An anisotropic etch process may be performed on wafer 10 to create through-silicon-via (TSV) recesses 138 in the BEOL layers 120 and substrate 100, as shown. In order to prevent any conducting material in a subsequent processing step from diffusing into any active portions of the circuitry of wafer 10, liner oxide 133, such as silicon nitride, is deposited in a layer over wafer 10, including TSV recesses 138.

Figure 3B:
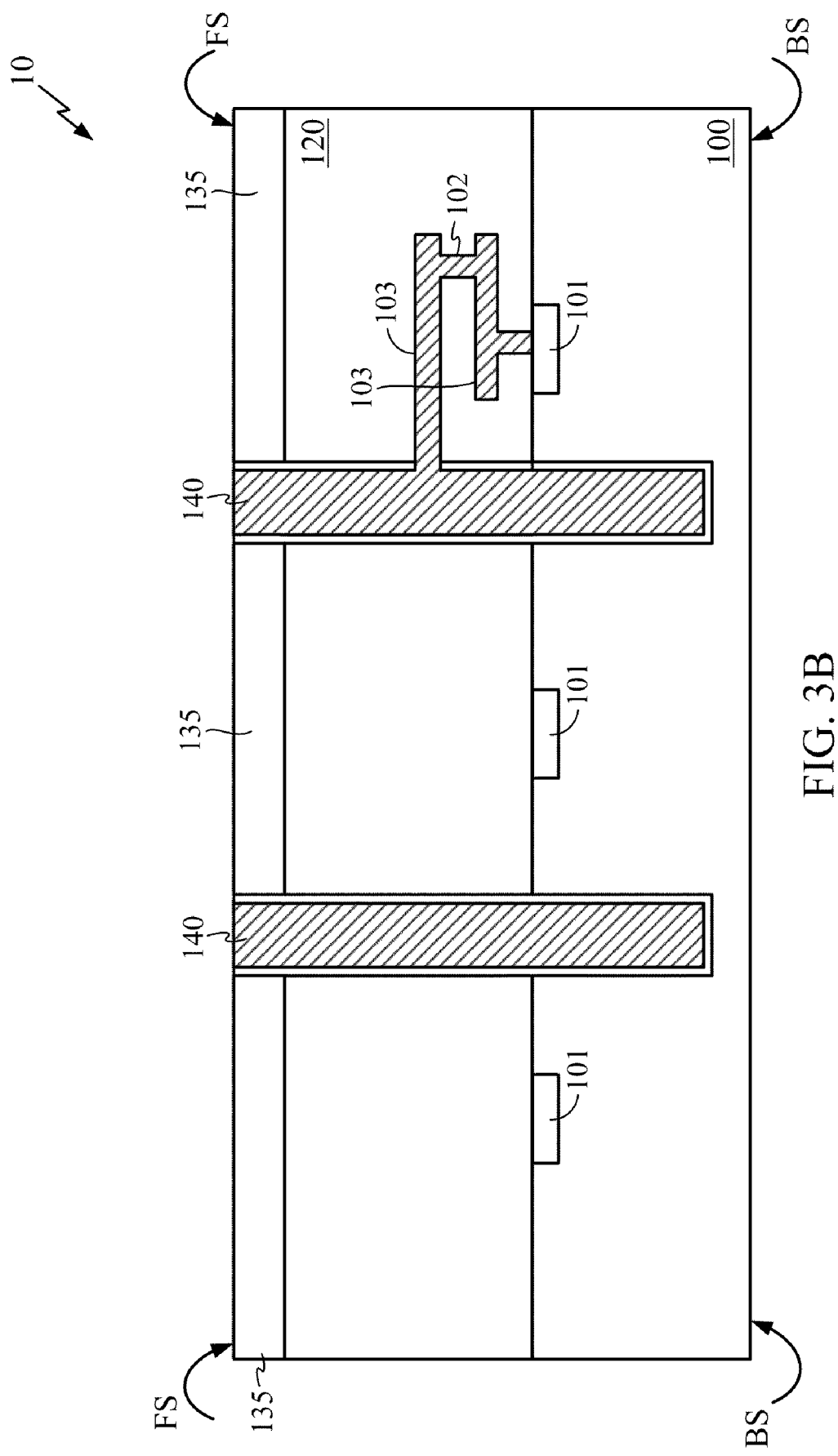

Shown in FIG. 3B, a layer of conducting material is deposited onto wafer 10. Conducting material may comprise various materials, such as copper, tungsten, aluminum, gold, silver, and the like. Conducting material fills TSV recesses 138. After removing the excess portions of the conducting material on the wafer surface, either through etching, chemical mechanical polishing (CMP), or the like, wafer 10 now comprises TSVs 140 formed in substrate 100 and BEOL layers 120. It is also illustrated in FIG. 3B that, after the formation of TSVs 140, one or more devices 101 may be electrically coupled to one or more TSVs 140 through one or more metal traces 103 in various interconnect metal layers. In FIG. 3B, the front surface of wafer 10 is labeled as "FS," and the back surface of wafer 10 is labeled as "BS."

Figure 3C:
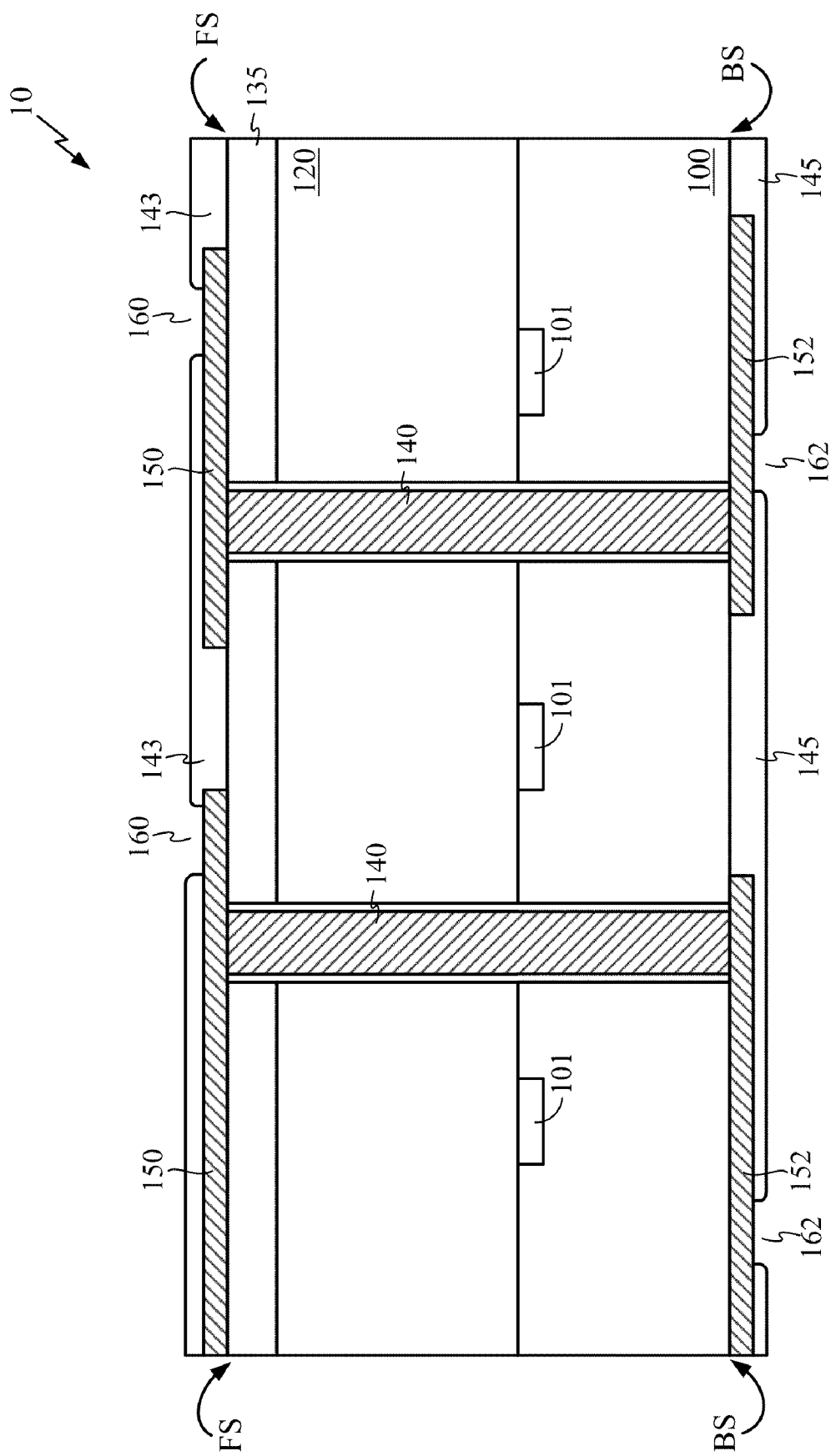

Continuing in FIG. 3C, another metal deposition process may be performed on the front surface "FS" of wafer 10, followed by an existing photolithography-etch process flow to form patterned conductive re-distribution (RDL) layer 150. A passivation layer 143 may be subsequently formed over wafer 10 to electrically insulate RDL layer 150 from any other circuitry or devices in any wafers bonded to wafer 10 in an embodied POG RFIC. Passivation layer 143 may also protect RDL layer 150 from other harmful circumstances. Further, bonding pads 160 are opened to RDL layer 150 through passivation layer 143, where electrical contacts are needed to circuitry or devices in any other wafers bonded to wafer 10 in an embodied POG RFIC.

In addition, a wafer thinning process such as etching, back grinding, CMP, or the like, is performed on the back surface "BS" of wafer 10. Portions of substrate 100 are removed to reveal contact points with TSVs 140. After removing such portions of substrate 100, TSVs 140 may slightly protrude from the back surface of substrate 100. In one embodiment, a metal deposition process is performed on the thinned back surface "BS" of wafer 10, followed by an existing photolithography-etch process flow to form patterned conductive re-distribution (RDL) layer 152. A passivation layer 145 may be subsequently formed over RDL layer 152 to electrically insulate RDL layer 152 from any other circuitry or devices in any wafers bonded to wafer 10 in an embodied RFIC package. Bonding pads 162 are opened to RDL layer 152 through passivation layer 145, where electrical contacts are needed to other circuitry or devices in any other wafers bonded to wafer 10 in an embodied RFIC package.

It is noted that configurations of RDL layers 150 and/or 152 are designed and processed to provide desirable advantages to the performance of the embodied POG RFICs of the current invention. As an example, RDL layers 150 and/or 152 include features that are formed to shield devices 101 from electromagnetic interfaces from any other circuitry or devices in any other wafers bonded to wafer 10. Details of these advantageous features will be described below.

Materials used for RDL layers 150 and 152 comprise metal selected from the group consisting of aluminum (Al), copper (Cu), silver (Ag), tungsten (W), and combinations thereof, although other metals/metal alloys are also within the contemplated scope of the invention. Materials used for passivation layers 143 and 145 may include silicon dioxide ($SiO_2$), silicon nitride ($Si_3N_4$), or other suitable materials, such as insulating polymers. In forming an embodied RFIC in a POG configuration, wafer 10 is electrically coupled to other circuitry or devices in other wafers bonded through bonding pads 160 and/or 162.

It is noted that, in above description, only two TSVs are shown for the ease of illustration and clarity. Those skilled in the art shall realize that, in practice, wafer 10 may include many TSVs 140 after the above processing steps. It is also noted from the above description that TSVs 140 are illustrated to be formed through a "via-last" processing approach, where TSVs 140 are formed after the CMOS FEOL and BEOL processing steps, for illustrative purpose only. Those skilled in the art shall realize that, in practice, TSVs may be formed in wafer 10 before, during, or after the CMOS FEOL processing steps, or before, during, or after the CMOS BEOL processing steps. As an example, in another embodiment, TSVs 140 are formed through a "via-first" processing approach, where TSVs 140 are formed after the formation of devices 101 through a FEOL processing flow, but before the formation of interconnect metal layers 103 processed through a CMOS BEOL processing flow. The formation of TSVs for the various embodiments of the present invention are not limited to any specific processing techniques, materials, processing steps, and order of processing steps.

Figure 4A:
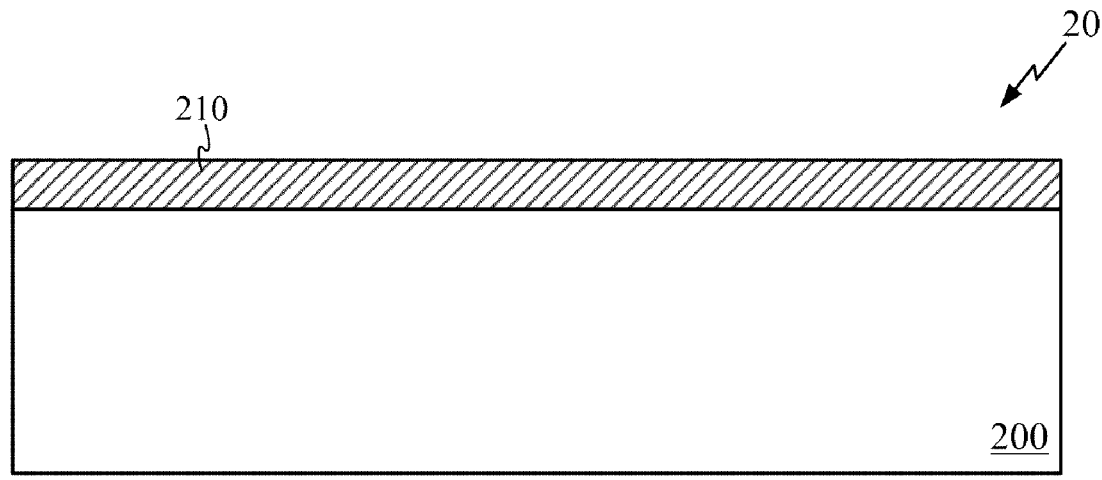
FIGS. 4A-4C illustrate forming a Passive-On-Glass (POG) die of an RFIC in an illustrative embodiment.

FIG. 4A illustrates forming another component in an embodied POG RFIC. A portion of wafer 20 is illustrated. Wafer 20 includes dielectric substrate 200, which is typically a glass material with high electrical resistivity, such as fused silica, quartz, silicon dioxide, silicate, the like, but may also be made of other suitable dielectric materials, such as silicon nitride, silicon carbide, silicon oxynitride, ceramics, glass ceramics, plastics, polymers, epoxies and the like. In an exemplary embodiment, substrate 200 is a 1737 AMLCD glass substrate (Alkaline Earth Boro-Aluminosilicate glass) made by Corning® Inc.

A conductive layer 210 is formed on top of substrate 200. Materials for conductive layer 210 may include any conductive materials suitable for making an RF inductor or other RF passive components. In one preferred embodiment, conductive layer 210 is metal or metal alloy, such as aluminum, copper, aluminum-copper, tungsten, and the like. Conductive layer 210 may be formed through film deposition processes, such as chemical vapor deposition (CVD), spin-on, sputtering, electroplating, and this like.

Figure 4B:
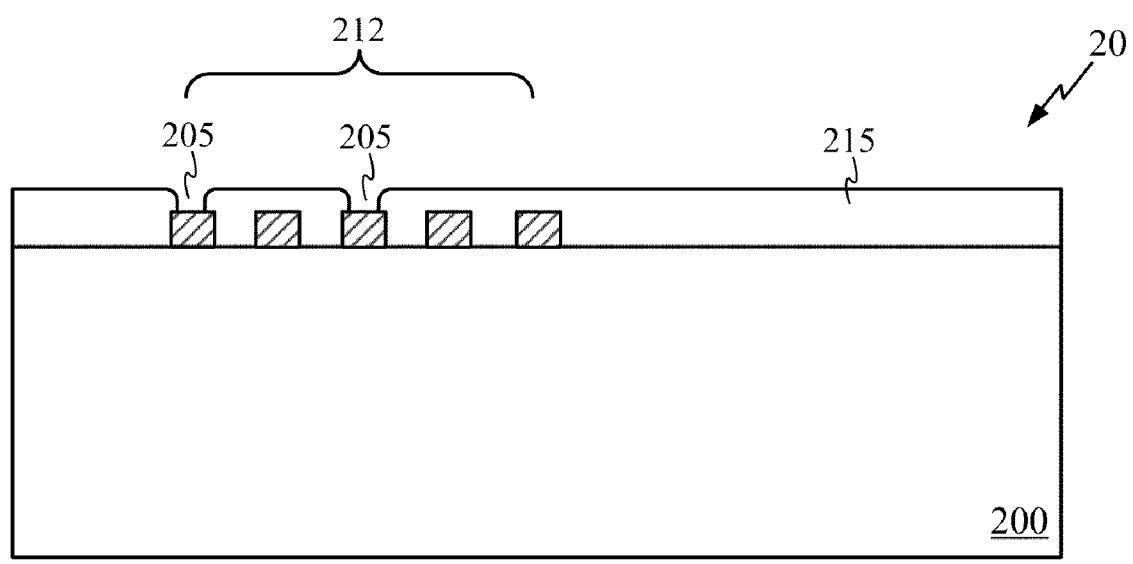

Continuing in FIG. 4B, a photolithography-etch process flow may be performed on metal layer 210 to form inductor 212. A dielectric layer 215 may be subsequently formed over glass wafer 20 to electrically insulate inductor 212 from the any other circuitry or devices. Dielectric layer 215 may include silicon dioxide ($SiO_2$), silicon nitride ($Si_3N_4$), or other suitable materials, such as insulating polymers. Inductor 212 thus formed may have various configurations, such as a square planar spiral inductor, a hollow spiral inductor, a circular spiral inductor, an octagonal spiral inductor, etc. Contact openings 205 may be formed through dielectric layer 215 by known processes to provide electrical connections to the center and the edge of the spiral of inductor 212, respectively.

Figure 4C:
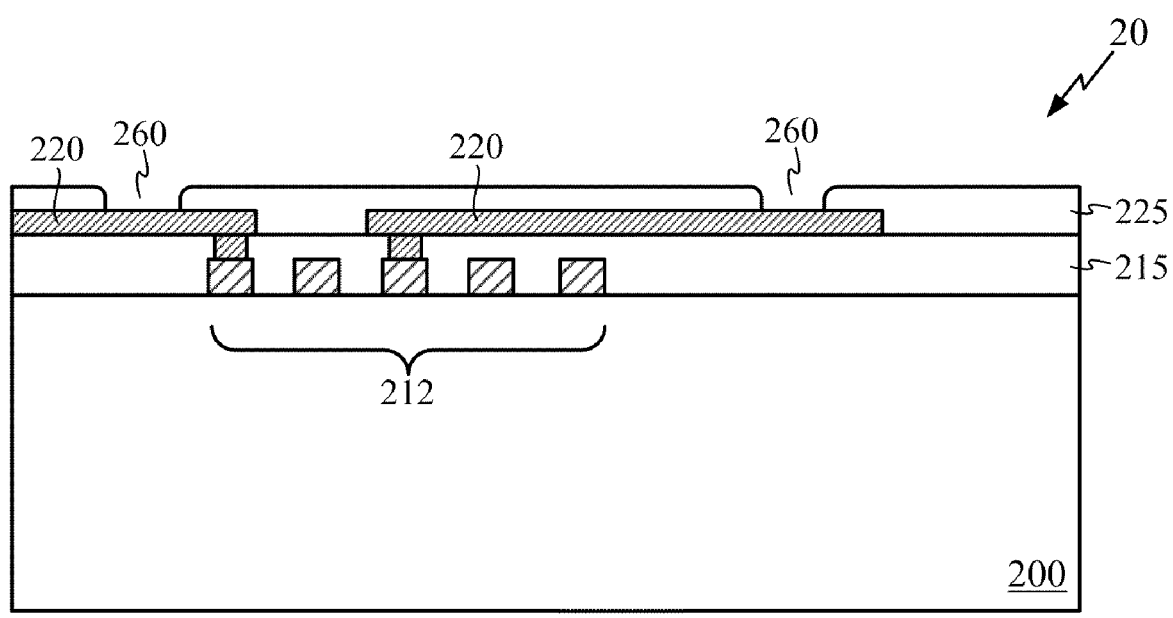

Illustrated in FIG. 4C, another metal deposition process may be performed on the front surface of wafer 20, followed by an existing photolithography-etch process flow to form patterned conductive re-distribution (RDL) layer 220. A passivation layer 225 may be subsequently formed over wafer 20 to electrically insulate RDL layer 220 from any other circuitry or devices in any wafers bonded to wafer 20 in an embodied POG RFIC. Moreover, bonding pads 260 are opened to RDL layer 220 through passivation layer 225, where electrical contacts to any other wafers are needed in an embodied RFIC package. Furthermore, the configurations of RDL layer 220 may be designed and processed to provide electrical shielding to inductors 212 formed in wafer 20. Details about the advantageous features of RDL layer 220 will be described below.

It is noted that other suitable processing techniques known to the people skilled in the art, such as an existing damascene process may also be used to form inductor 212 and RDL layer 220. It is also noted that inductor 212 and the process of forming inductor 212 shown above are for the ease of illustration and clarity. Those skilled in the art shall realize that, in practice, many inductors of various parameters and configurations may be formed in wafer 20 after the above illustrative processing steps. In an exemplary embodiment, an array of square planar spiral inductors of large values is formed through the above processing steps. In another exemplary embodiment, more than one conductive layers 210 are formed on top of substrate 200. Planar spiral inductors may be formed in the various ones of the conductive layers 210. In addition, Metal-Insulator-Metal (MIM) capacitors may be also formed between adjacent conductive layers 210.

It is further noted that the bonding pads, such as bonding pads 160 and 162 on wafer 10 and bonding pads 260 on wafer 20, formed from the above exemplary embodiments may be recessed below their respective bonding surface, as illustrated in the exemplary embodiments. In additional and/or alternative embodiments, bonding pads formed on wafers 10 and 20 or other wafers in an embodied RFIC package may not be recessed below their respective bonding surfaces. Instead, the bonding pads 160, 162 and 260 on wafers 10 and 20 may be level with or elevated slightly above their respective bonding surface.

Figure 5:
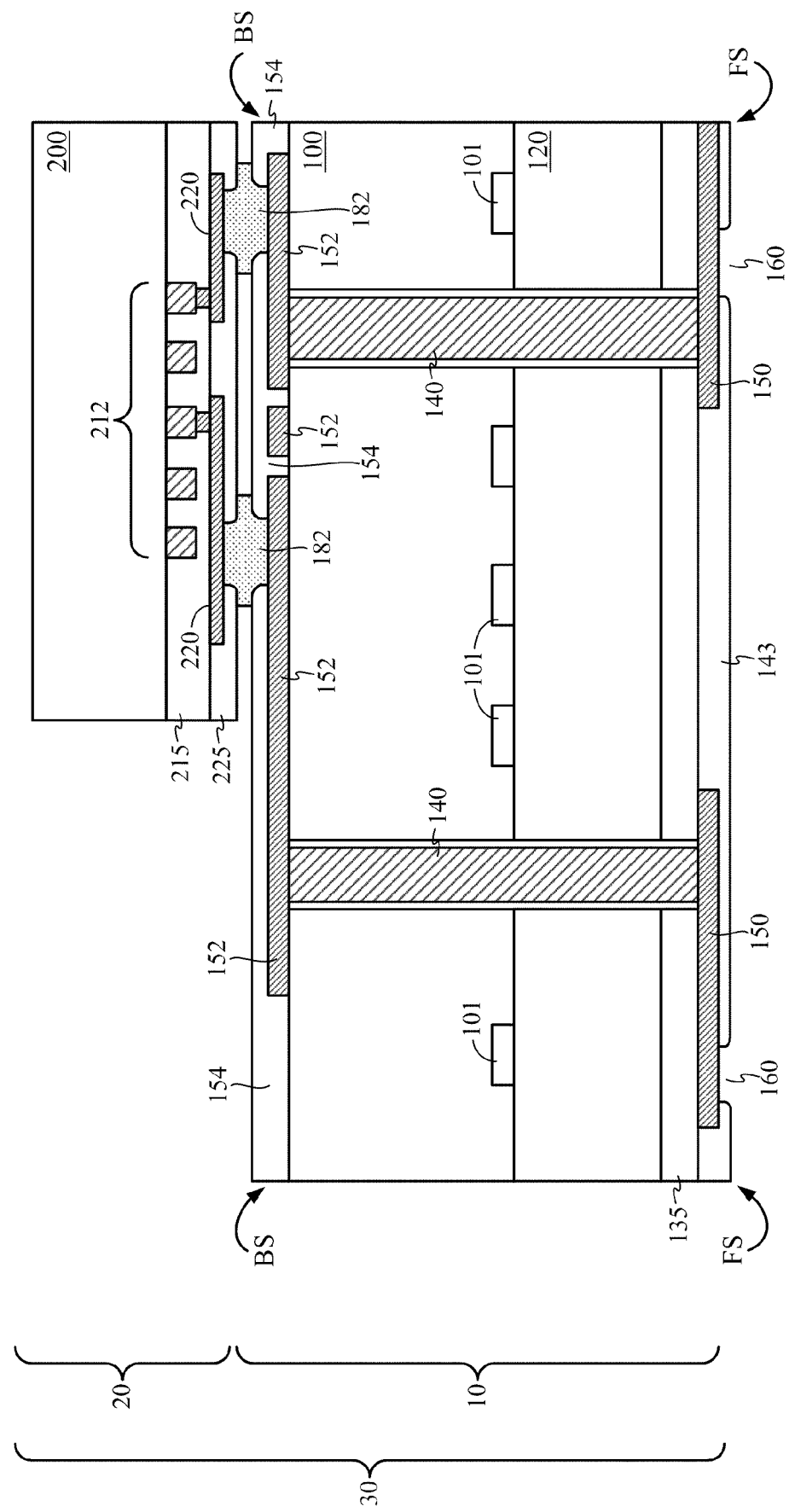
FIG. 5 is a cross-sectional view of a stacking die structure of an RFIC in an illustrative embodiment.

FIG. 5 illustrates bonding wafers 10 and 20 described above to form a stacking RFIC 30 in one exemplary embodiment. Wafers 10 and 20 are bonded together through forming bonding contacts 182 at bonding pads 162 on the "BS" surface of wafer 10 and bonding pads 260 on the front surface of wafer 20. As a result, inductors formed in glass wafer 20 such as spiral inductor 212 are electrically coupled to devices 101 in wafer 10 through RDL layer 220, bonding contacts 182, RDL layer 152, TSVs 140, and metal traces 103 (shown in FIG. 3B), for example. The stacking RFIC 30 structure is also generally referred to have a Passive-On-Glass (POG) configuration, where passive devices are formed on one or more separate dielectric (e.g., glass) substrates.

It is noted that any of several different conductive materials may be used to create the bonding contacts 182 in the various embodiments of the present invention. The conductive materials used to form bonding contacts 182 may be copper, tungsten, gold, aluminum, aluminum-copper, copper-tin alloy, gold-tin alloy, indium-gold alloy, lead-tin alloy, copper-silver-tin alloy, combinations thereof, or the like. The present invention is not intended to be limited to any one or a simple set of such conductive materials.

It is also noted that bonding contacts 182 are shown to provide electrical connection between inductors 212 in wafer 20 and any circuitry and devices in other wafers for illustrative purpose only. In the various embodiments of the present invention, any of various suitable low-resistance bonding features may be used for electrically coupling wafer 20 to wafer 10. In an exemplary embodiment, the bonding pads 160 and 260 may be slightly elevated from the bonding surface of the wafers 10 and 20, respectively. Wafer 20 is bonded to wafer 10 by compressing the two wafers using a pre-calculated pressure. In another exemplary embodiment, bonding between wafer 10 and wafer 20 is conducted at the wafer level, where slightly elevated pads 160 and 260 are bonded together through adhesives. In another exemplary embodiment, bonding pads 160 and 260 may be slightly below their respective bonding surface of wafers 10 and 20, low-resistance bonding connections between bonding pads 160 and 260 are made using pins, Gull-wings, J-bends, solder balls, lands, and the like. The specific bonding structures illustrated herein are not intended to limit the embodiments of the present invention in any way.

Figure 6:
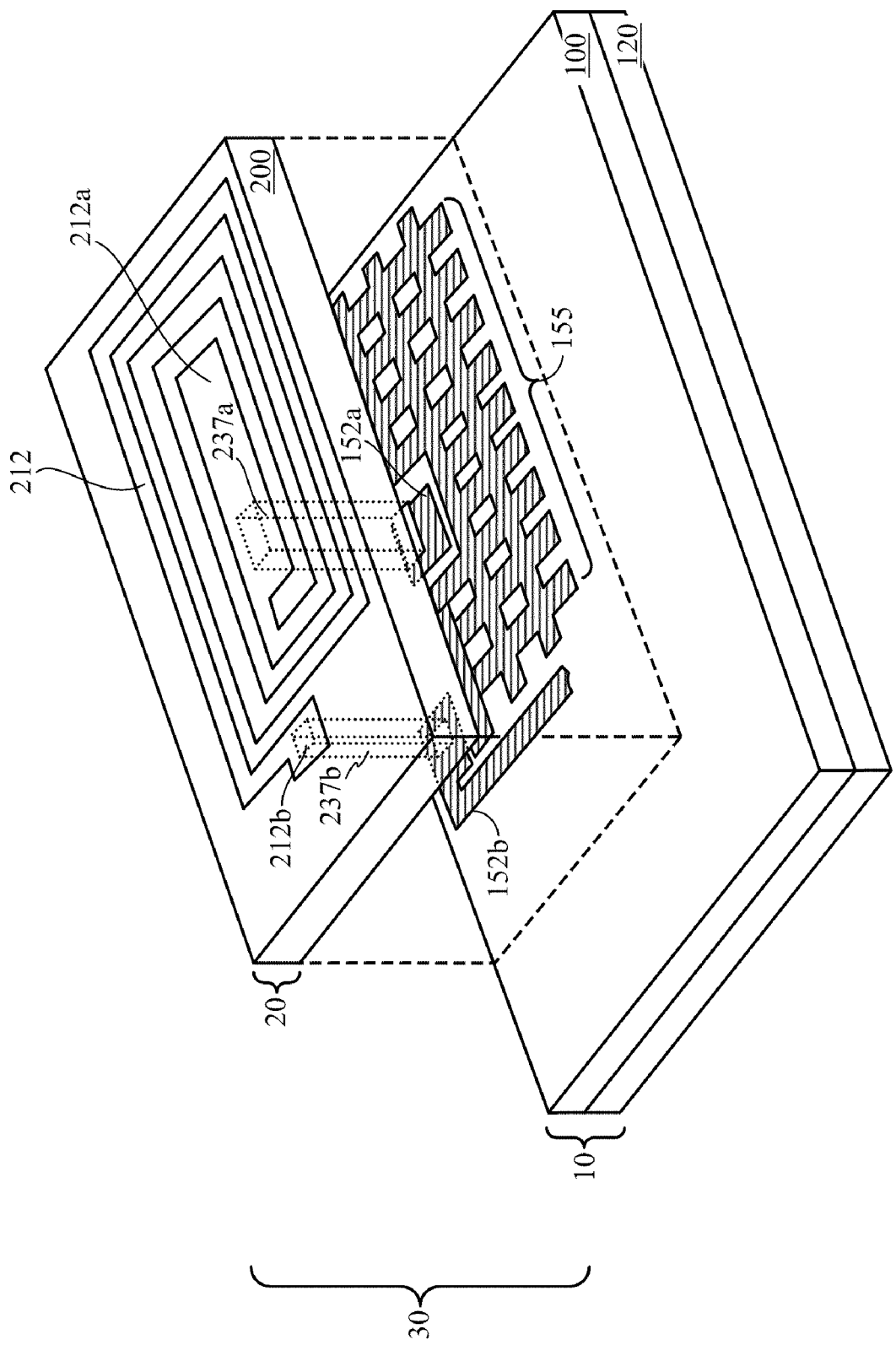
FIG. 6 is an expanded top view of the stacking die structure illustrated with respect to FIG. 5, illustrating an embodied electrical shield structure.

FIG. 6 shows an expanded top view of stacking RFIC 30 of the exemplary embodiment described above, illustrating an advantageous feature of RDL layer 152 on wafer 10. In FIG. 6, square spiral inductor 212 has a center conductor 212a and an edge conductor 212b. The center conductor 212a and the edge conductor 212b are electrically coupled to signal routings 152a and 152b in the RDL layer 152 of wafer 10, respectively. For the ease of illustration and clarity, RDL layer 220 in wafer 20, contact pads 162 on wafer 10 and contact pads 260 on wafer 20, and bonding contacts 182, which are typically used to provide electrical connections between 212a, 221b and 152a, 152b are not shown. Instead, in FIG. 6, dashed columns 237a is used to represent the electrical connection between the center conductor 212a of inductor 212 and signal routing 152a in RDL layer 152; dashed columns 237b is used to represent the electrical connection between the edge conductor 212b of inductor 212 and signal routing 152b in RDL layer 152. Signal routings 152a and 152b may be electrically coupled to the other devices and circuitry 101 in wafer 10 through TSVs 140 and/or metal traces 103 (not shown), as described previously with respect to FIG. 5.

Also formed in RDL layer 152 includes electrical shield structure 155 between wafer 10 and inductor 212 in wafer 20. Shield structure 155 is typically electrically coupled to ground through one or more vias (not shown) down to one of the topmost interconnect metal layers, which are typically used for power supply and ground in an integrated circuit chip. In one preferred embodiment, shield structure 155 has a mesh configuration as shown, although other suitable shielding structure configurations, such as a fish bone configuration, may be also used. Shield structure 155 and signal routings in RDL layer 152 are typically made of same conductive metal and formed through a common metal-deposition-lithography-etch process flow. In another embodiment where an array of inductors is formed in wafer 20, more the one shield structures 155 in RDL layer 152 are formed between the inductor array and wafer 10.

In preferred embodiments, shield structure 155 and methods of forming the same provide various advantageous features. First, shield structure 155 electrically isolates devices and circuitry in wafer 10 from inductors in wafer 20, which may lead to significant improvement on the overall system performance. As an example, due to the presence of shield structure 155, devices and circuitry 101 are substantially shielded from electro-magnetic interference (e.g., varying magnetic flux) from inductors 212 in wafer 20. Furthermore, any induced current in shield structure 155 is drained to ground. As a result, wafer 10 substrate areas under inductors 212 can be utilized for devices and circuitry, which may significantly reduce the form factor of an RFIC. As another advantageous feature, inductors 212 are formed on high resistivity substrate, such as a glass substrate. In an exemplary embodiment, the quality factor of inductor 212 is 50% greater than an inductor of a similar configuration formed on a doped silicon substrate. As an additional advantage, the method of forming shield structure 155 in an illustrated POG RFIC does not require extra processing steps. Shield structure 155 is formed along with the RDL layer 512 through a common process flow.

In an additional and/or alternative embodiment, shield structure providing similar advantageous features is formed in the RDL layer 220 on wafer 20 (FIG. 4C). As an example, a shield mesh is formed with signal routings in RDL layer 220 through a common metal-deposition-lithography-etch process flow. Same conductive metal may be used for the shield mesh and the signal routings in RDL layer 220.

Figure 7:
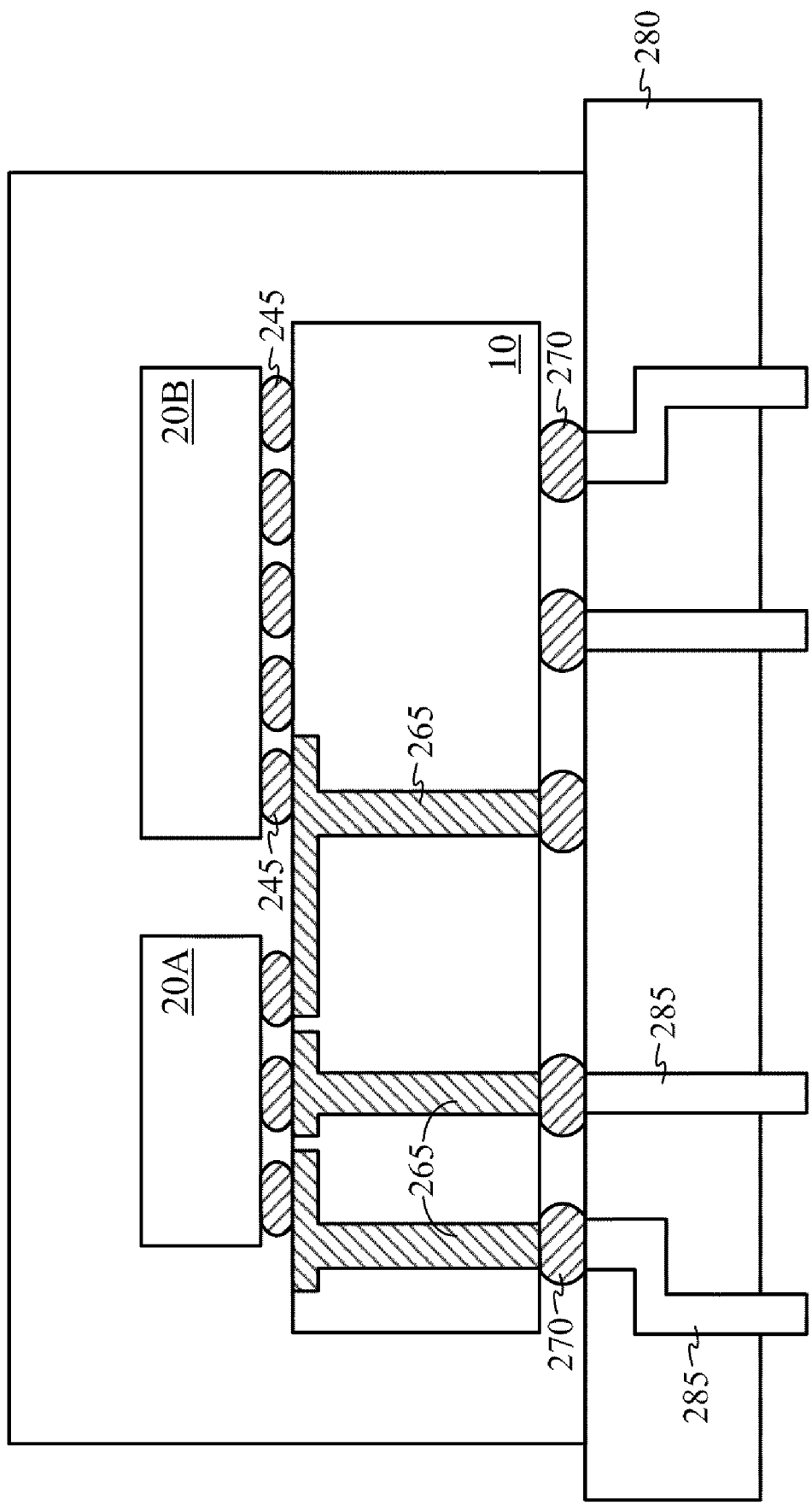
FIG. 7 illustrates a POG RFIC package in an illustrative embodiment.

FIG. 7 illustrates an exemplary POG RFIC package, which includes two POG dies 20A and 20B. The POG dies 20A and 20B are electrically coupled to wafer 10 through solder bumps 245, where the other devices and circuitry, such as devices and circuitry 101 illustrated previously, are formed in an embodied POG RFIC. TSVs 265 are formed in wafer 10 to provide electrical connections to devices and circuitry in wafer 10. FIG. 7 also illustrates that solder balls 270 are bonded to the bonding pads on the "FS" surface of wafer 10. In one exemplary embodiment where an embodied POG RFIC 30 is used for portable applications, multiple row of solder balls 270 are bonded to multiple bonding contacts on the "FS" surface of wafer 10. The stacking RFIC structure is subsequently attached to a package substrate 280 to form a ball grid array (BGA) RFIC package. Devices and circuitry in the embodied RFIC package are electrically coupled to a printed circuit board (PCB, not shown) through package leads 285.

The embodied POG RFIC package described above may be formed when, for example, 20A, 20B and wafer 10 are fabricated by different processing technologies and facilities. When the layout design of an embodied POG RFIC is completed, a designer can coordinate with a silicon die manufacturer (e.g., foundry), a POG manufacturer and a packaging site to produce packaged POG RFIC products in large scale. For example, after an RFIC is designed and prototype circuit die is evaluated at the system level on an evaluation board, an integrated circuit layout database is finalized and the parameters of passive components are decided upon. The layout database of a silicon CMOS die is sent to a semiconductor manufacturing facility (FAB) for mass production, while the layout database of a POG dies are sent to a POG manufacturing facility. Wafers produced from the FAB and from the POG manufacturing facility are shipped to an assembly site for packaging. At the packaging site, a customer may choose the proper packaging scheme suitable for the POG die and the CMOS silicon die to achieve desired circuit performance.

Although the present invention and its advantages have been described in detail, it should be understood that various changes, substitutions and alterations can be made herein without departing from the spirit and scope of the invention as defined by the appended claims. As an example, it will be readily understood by those skilled in the art that components, materials, and configurations according to the preferred embodiments described above may be varied, substituted, combined to form even more POG RFIC packaging configurations, while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A radio frequency integrated circuit (RFIC) comprising:
   at least one microelectronic device in a semiconductor substrate;
   at least one through-silicon-via (TSV) in the semiconductor substrate;
   at least one electrical shield structure on a first surface of the semiconductor substrate; and
   at least one inductor on a front surface of a dielectric substrate, the front surface of the dielectric substrate bonded to the first surface of the semiconductor substrate in a stacking manner, wherein the at least one inductor is positioned between the semiconductor substrate and the dielectric substrate; and
   wherein the at least one electrical shielding structure electrically shields the at least one microelectronic device from the at least one inductor.

2. The RFIC of claim 1, wherein the at least one electrical shield structure is formed in a re-distribution (RDL) layer on the first surface.

3. The RFIC of claim 1, wherein the at least one inductor includes at least one of a square planar spiral inductor, a hollow spiral inductor, a circular spiral inductor, or an octagonal spiral inductor.

4. The RFIC of claim 1, wherein the dielectric substrate comprises a high resistivity dielectric material, and wherein the high resistivity dielectric material includes at least one of fused silica, quartz, silicon dioxide, silicate, silicon nitride, silicon carbide, silicon oxynitride, a ceramic, glass, a glass ceramic, a plastic, a polymer, an epoxy, or any combination thereof.

5. The RFIC of claim 1, wherein the at least one electrical shield structure is formed between the at least one inductor and the at least one microelectronic device, and wherein the at least one electrical shield structure comprises a mesh configuration.

6. A radio frequency integrated circuit (RFIC) in a Passive-On-Glass (POG) package configuration, the RFIC comprising:
one or more microelectronic devices within a semiconductor substrate;
one or more pass-through-vias within the semiconductor substrate;
one or more passive devices on a surface of a dielectric substrate, wherein the dielectric substrate is bonded to the semiconductor substrate in a stacking manner, wherein the one or more passive devices are positioned between the semiconductor substrate and the dielectric substrate, and wherein the one or more passive devices is electrically coupled to the one or more microelectronic device through the one or more pass-through-vias; and
means for shielding the one or more microelectronic devices from the one or more passive devices.

7. The RFIC of claim 6, wherein the means for shielding is a conductive mesh structure between the one or more microelectronic devices and the one or more passive devices, the conductive mesh structure being formed in a re-distribution (RDL) layer on a first surface of the semiconductor substrate.

8. The RFIC of claim 6, wherein the one or more passive devices includes at least one of a Metal-Insulator-Metal (MIM) capacitor, a square planar spiral inductor, a hollow spiral inductor, a circular spiral inductor, or an octagonal spiral inductor.

9. The RFIC of claim 6, wherein the dielectric substrate comprises a high resistivity dielectric material, and wherein the high resistivity dielectric material includes at least one of fused silica, quartz, silicon dioxide, silicate, silicon nitride, silicon carbide, silicon oxynitride, a ceramic, glass, a glass ceramic, a plastic, a polymer, an epoxy, or any combination thereof.

10. The RFIC of claim 6, wherein the one or more passive devices comprise one or more inductors of a radio frequency (RF) module of a wireless communication device.

11. The RFIC of claim 6, wherein the means for shielding includes tungsten (W) or silver (Ag).

12. The RFIC of claim 1, wherein the at least one inductor is electrically coupled to the at least one microelectronic device through at least one of the at least one TSVs.

13. The RFIC of claim 1, wherein the at least one microelectronic device comprises a metal-oxide-semiconductor field-effect transistor (MOSFET), a bipolar junction transistor (BJT), diodes, a resistor, a capacitors, a cluster of active or passive devices, a memory, or any combinations thereof.

14. The RFIC of claim 1, wherein the at least one electrical shield structure comprises a mesh configuration.

15. The RFIC of claim 1, wherein the at least one electrical shield structure comprises a fish bone configuration.

16. The RFIC of claim 1, wherein a dielectric layer is formed over at least a portion of the at least one inductor, wherein a re-distribution (RDL) layer is formed on the dielectric layer, the RDL layer in electrical contact with the at least one inductor, and wherein a passivation layer is formed over at least a portion of the RDL layer.

17. The RFIC of claim 1, wherein the at least one electrical shield structure includes silver (Ag).

18. The RFIC of claim 1, wherein the at least one electrical shield structure includes tungsten (W).

19. The RFIC of claim 1, wherein the semiconductor substrate includes at least one of silicon (Si), germanium (Ge), silicon germanium (SiGe), gallium arsenide (GaAs), gallium arsenide-phosphide (GaAsP), indium phosphide (InP), gallium aluminum arsenic (GaAlAs), indium gallium phosphide (InGaP), or any combination thereof.

20. The RFIC of claim 1, wherein the dielectric substrate is physically bonded to the semiconductor substrate at a first plurality of contact pads on the first surface of the semiconductor substrate and a second plurality of contact pads on the front surface of the dielectric substrate.

21. The RFIC of claim 20, wherein the first plurality of contact pads on the first surface of the semiconductor substrate is included in a re-distribution (RDL) layer on the first surface.

22. The RFIC of claim 20, where the first plurality of contact pads is electrically bonded to the second plurality of contact pads via one or more bonding contacts.

23. The RFIC of claim 20, wherein the one or more bonding contacts include copper (Cu), tungsten (W), gold (Au), aluminum (Al), aluminum-copper, a copper-tin alloy, a gold-tin alloy, an indium-gold alloy, a lead-tin alloy, a copper-silver-tin alloy, or any combination thereof.

24. The RFIC of claim 2, wherein the RDL layer includes at least one metal comprising aluminum (Al), copper (Cu), silver (Ag), tungsten (W), or any combination thereof.

25. The RFIC of claim 2, wherein the RDL layer and the at least one electrical shield structure include a same metal.

26. The RFIC of claim 25, wherein the same metal is tungsten (W).

27. The RFIC of claim 2, further comprising a passivation layer formed over at least a portion of the RDL layer.

28. The RFIC of claim 27, wherein the dielectric substrate is physically bonded to the semiconductor substrate at a first plurality of contact pads included in the RDL layer and a plurality of contact pads on the front surface of the dielectric substrate, and wherein the passivation layer is not formed over the first plurality of contact pads included in the RDL layer.

29. The RFIC of claim 27, wherein the passivation layer includes at least one of silicon dioxide ($SiO_2$), silicon nitride ($Si_3N_4$), or an insulating polymer.

30. A radio frequency integrated circuit (RFIC) comprising:
a semiconductor substrate including a first front surface and a first back surface, the semiconductor substrate comprising:
a microelectronic device in the semiconductor substrate;
a through-silicon-via (TSV) in the semiconductor substrate; and
an electrical shield structure on the first back surface of the semiconductor substrate; and
a dielectric substrate including a second front surface and a second back surface, the dielectric substrate comprising an inductor on the second front surface of the dielectric substrate;
wherein the semiconductor substrate is bonded to the dielectric substrate;
wherein the inductor is electrically bonded to the TSV via a bonding contact; and
wherein the inductor is positioned between the semiconductor substrate and the dielectric substrate.

* * * * *